(12) United States Patent
Noro et al.

(10) Patent No.: US 8,946,030 B2
(45) Date of Patent: Feb. 3, 2015

(54) METHOD FOR FORMING DUMMY GATE

(71) Applicant: Tokyo Electron Limited, Tokyo (JP)

(72) Inventors: Motoki Noro, Hsin-Chu (TW);
Tai-Chuan Lin, Hsin-Chu (TW); Shinji Kawada, Hsin-Chu (TW)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/109,231

(22) Filed: Dec. 17, 2013

(65) Prior Publication Data
US 2014/0170842 A1   Jun. 19, 2014

(30) Foreign Application Priority Data

Dec. 18, 2012   (JP) .................... 2012-275741

(51) Int. Cl.
| | |
|---|---|
| *H01L 21/311* | (2006.01) |
| *H01L 21/8234* | (2006.01) |
| *H01L 27/088* | (2006.01) |
| *H01L 29/49* | (2006.01) |
| *H01L 29/78* | (2006.01) |
| *H01L 21/3213* | (2006.01) |
| *H01L 29/66* | (2006.01) |
| *H01J 37/32* | (2006.01) |

(52) U.S. Cl.
CPC .... *H01L 21/32137* (2013.01); *H01L 29/66545* (2013.01); *H01J 37/32082* (2013.01); *H01J 37/32192* (2013.01)

USPC .......... 438/283; 438/695; 438/696; 438/713; 438/714; 438/595

(58) Field of Classification Search
CPC ..................... H01L 21/3213; H01L 21/32139; H01L 21/28008; H01L 21/32137; H01L 21/0337; H01L 21/31116
USPC ................................... 438/585, 696
See application file for complete search history.

(56) References Cited

U.S. PATENT DOCUMENTS

| | | | | |
|---|---|---|---|---|
| 5,685,950 | A * | 11/1997 | Sato ............................. | 438/713 |
| 7,361,958 | B2 * | 4/2008 | Brask et al. .................. | 257/369 |
| 7,560,756 | B2 | 7/2009 | Chau et al. | |
| 2005/0214987 | A1 * | 9/2005 | Shah et al. ................... | 438/151 |
| 2006/0021702 | A1 * | 2/2006 | Kumar et al. ............ | 156/345.32 |

* cited by examiner

*Primary Examiner* — Olik Chaudhuri
*Assistant Examiner* — Christine Enad
(74) *Attorney, Agent, or Firm* — Rothwell, Figg, Ernst & Manbeck, P.C.

(57) ABSTRACT

Disclosed is a method of forming a dummy gate in manufacturing a field effect transistor. The method includes a first process of exposing a workpiece having a polycrystalline silicon layer to plasma of HBr gas, and a second process of further exposing the workpiece to the plasma of HBr gas after the first process. The first process includes etching the polycrystalline silicon layer to form a dummy semiconductor part having a pair of side surfaces from the polycrystalline silicon layer, and forming a protection film based on a by-product of etching on the pair of side surfaces in such a manner that the thickness of the protection film becomes smaller toward a lower end of the dummy semiconductor part.

8 Claims, 26 Drawing Sheets

FIG.12

TABLE 1

| PROCESS | MICROWAVE POWER (W) | BIAS POWER (W) | Ar (sccm) | HBr (sccm) | Cl₂ (sccm) | O₂ (sccm) | STAGE TEMPERATURE (°C) | PROCESSING TIME (sec) |
|---|---|---|---|---|---|---|---|---|
| S1 | 1500 | 200 | 1000 | 800 | | 10 | 60 | EPD |
| S2 (TEST EXAMPLE 1) | 1500 | 250 | 1000 | 800 | | 15 | 60 | 15 |
| S2 (TEST EXAMPLE 2) | 1500 | 250 | 1000 | 800 | | 15 | 60 | 60 |

FIG.13

TABLE 2

| | TEST EXAMPLE 1 | TEST EXAMPLE 2 |
|---|---|---|
| CROSS-SECTIONAL VIEW | (114, 110, DS, 206) | (114, 110, DS, 206) |
| TOP CD (nm) | 37.9 | 35.5 |
| INTERMEDIATE CD (nm) | 37.1 | 28.1 |
| BOTTOM CD (nm) | 39.1 | 27.3 |

FIG.14

TABLE 3

| | PROCESS | MICROWAVE POWER (W) | BIAS POWER (W) | Ar (sccm) | HBr (sccm) | Cl₂ (sccm) | O₂ (sccm) | STAGE TEMPERATURE (°C) | PROCESSING TIME (sec) |
|---|---|---|---|---|---|---|---|---|---|
| TEST EXAMPLE 3 | S1 | 1500 | 200 | 1000 | 800 | | 10 | 60 | EPD |
| | S2 | 1500 | 250 | 1000 | 800 | | 15 | 60 | 30 |
| TEST EXAMPLE 4 | S1 | 1500 | 200 | 1000 | 800 | | 10 | 70 | EPD |
| | S2 | 1500 | 250 | 1000 | 800 | | 15 | 70 | 30 |

FIG.15

TABLE 4

| CROSS-SECTIONAL VIEW | TEST EXAMPLE 3 | TEST EXAMPLE 4 |
|---|---|---|
| TOP CD (nm) | 33.1 | 35.5 |
| BOTTOM CD (nm) | 36 | 29.5 |

FIG.16

TABLE 5

| | PROCESS | MICROWAVE POWER (W) | BIAS POWER (W) | Ar (sccm) | HBr (sccm) | Cl₂ (sccm) | O₂ (sccm) | STAGE TEMPERATURE (°C) | PROCESSING TIME (sec) |
|---|---|---|---|---|---|---|---|---|---|
| TEST EXAMPLE 5 | S1 | 2500 | 150 | 1000 | 800 | | 15 | 60 | EPD |
| | S2 | 2500 | 150 | 1000 | 800 | | 15 | 60 | - |
| TEST EXAMPLE 6 | S1 | 2500 | 150 | 1000 | 600 | | 15 | 60 | EPD |
| | S2 | 2500 | 150 | 1000 | 600 | | 15 | 60 | - |
| TEST EXAMPLE 7 | S1 | 2500 | 150 | 1000 | 400 | | 15 | 60 | EPD |
| | S2 | 2500 | 150 | 1000 | 400 | | 15 | 60 | - |

FIG.19

TABLE 7

| PROCESS | MICROWAVE POWER (W) | BIAS POWER (W) | Ar (sccm) | HBr (sccm) | Cl₂ (sccm) | O₂ (sccm) | STAGE TEMPERATURE (°C) | PROCESSING TIME (sec) |
|---|---|---|---|---|---|---|---|---|
| S1 | 2000 | 200 | 1000 | 800 | | 10 | 60 | EPD |
| S2 (TEST EXAMPLE 8) | 1500 | 250 | 1000 | 800 | | 15 | 60 | 10 |
| S2 (TEST EXAMPLE 9) | 1500 | 250 | 1000 | 800 | | 15 | 60 | 25 |
| S2 (TEST EXAMPLE 10) | 1500 | 250 | 1000 | 800 | | 15 | 60 | 35 |
| S2 (TEST EXAMPLE 11) | 1500 | 250 | 1000 | 800 | | 15 | 60 | 45 |

FIG.20
TABLE 8

| | TEST EXAMPLE 8 | TEST EXAMPLE 9 | TEST EXAMPLE 10 | TEST EXAMPLE 11 |
|---|---|---|---|---|
| CROSS-SECTIONAL VIEW | | | | |
| TOP CD (nm) | 32.0 | 32.2 | 29.7 | 25.8 |
| INTERMEDIATE CD (nm) | 33.3 | 31.6 | 30.4 | 24.8 |
| BOTTOM CD (nm) | 33 | 20.3 | 18.8 | 15.2 |
| HEIGHT OF TAPERED SHAPE (nm) | 0 | 23.3 | 24.4 | 27.2 |

FIG.22

TABLE 9

| | PROCESS | MICROWAVE POWER (W) | BIAS POWER (W) | Ar (sccm) | HBr (sccm) | $Cl_2$ (sccm) | $O_2$ (sccm) | STAGE TEMPERATURE (°C) | PROCESSING TIME (sec) |
|---|---|---|---|---|---|---|---|---|---|
| TEST EXAMPLE 12 | S1 | 1700 | 200 | 1000 | 800 | | 10 | 60 | EPD |
| | S2 | 1500 | 250 | 1000 | 800 | | 15 | 60 | 20 |
| TEST EXAMPLE 13 | S1 | 2000 | 200 | 1000 | 800 | | 10 | 60 | EPD |
| | S2 | 1500 | 250 | 1000 | 800 | | 15 | 60 | 35 |
| TEST EXAMPLE 14 | S1 | 2300 | 200 | 1000 | 800 | | 10 | 60 | EPD |
| | S2 | 1500 | 250 | 1000 | 800 | | 15 | 60 | 40 |

FIG. 23

TABLE 10

| | TEST EXAMPLE 12 | TEST EXAMPLE 13 | TEST EXAMPLE 14 |
|---|---|---|---|
| CROSS-SECTIONAL VIEW | 114, 110, DS, 106, 102 | 114, 110, DS, 106, 102 | DS, 106, 102 |
| TOP CD (nm) | 29.5 | 29.7 | 29.5 |
| INTERMEDIATE CD (nm) | 27.8 | 30.4 | 31.1 |
| BOTTOM CD (nm) | 21.5 | 18.8 | 17.5 |
| HEIGHT OF TAPERED SHAPE (nm) | 39.7 | 24.4 | 23.5 |

FIG.25

TABLE 11

| | PROCESS | MICROWAVE POWER (W) | BIAS POWER (W) | Ar (sccm) | HBr (sccm) | Cl₂ (sccm) | O₂ (sccm) | STAGE TEMPERATURE (°C) | PROCESSING TIME (sec) |
|---|---|---|---|---|---|---|---|---|---|
| TEST EXAMPLE 15 | S1 | 2000 | 200 | 1000 | 800 | | 10 | 60 | EPD |
| | S2 | 1500 | 250 | 1000 | 800 | | 15 | 60 | 35 |
| | S3 | 3000 | 50 | | | 100 | | 60 | 5 |
| TEST EXAMPLE 16 | S1 | 2000 | 200 | 1000 | 800 | | 10 | 60 | EPD |
| | S2 | 1500 | 250 | 1000 | 800 | | 15 | 60 | 20 |
| | S3 | 3000 | 50 | | | 100 | | 60 | 10 |

FIG. 26
TABLE 12

| CROSS-SECTIONAL VIEW | TEST EXAMPLE 15 | | TEST EXAMPLE 16 | |
|---|---|---|---|---|
| | (BEFORE PROCESS S3) | (AFTER PROCESS S3) | (BEFORE PROCESS S3) | (AFTER PROCESS S3) |
| TOP CD (nm) | 28.8 | | | 32.5 |
| INTERMEDIATE CD (nm) | 28.1 | | | 32.1 |
| BOTTOM CD (nm) | 15.2 | | | 16.6 |
| TAPER ANGLE (°) BEFORE PROCESS S3 | 82.3 | | | 77.8 |
| TAPER ANGLE (°) AFTER PROCESS S3 | 69.4 | | | 66.3 |

METHOD FOR FORMING DUMMY GATE

CROSS-REFERENCE TO RELATED APPLICATIONS

This application is based on and claims priority from Japanese Patent Application No. 2012-275741, filed on Dec. 18, 2012 with the Japan Patent Office, the disclosure of which is incorporated herein in their entireties by reference.

TECHNICAL FIELD

An exemplary embodiment of the present disclosure relates to a method for forming a dummy gate in manufacturing a field effect transistor.

BACKGROUND

A conventional field effect transistor, that is, a planar type field effect transistor has a two dimensional shape in which a channel is fomied on a flat surface layer of a semiconductor surface and includes gate electrodes formed via a gate insulation film on the channel. Further, recently, a three dimensional shape transistor, that is, a fin type field effect transistor, in which a gate insulation film is provided to surround a fin type semiconductor part and a gate electrode is disposed to surround the gate insulation film in order to improve high-speed operation and low power consumption properties has been put into practical use. For example, see U.S. Pat. No. 7,560,756.

An electrode material may be supplied to a space formed by removing a dummy gate to form a gate electrode in manufacturing both the planar type and the fin type field effect transistors. Specifically, a dummy gate is formed, a sidewall spacer is formed along a side surface of the dummy gate, the dummy gate is removed, and the electrode material is supplied to a space formed by removing the dummy gate, that is, the space surrounded by the sidewall spacer, thereby forming the gate electrode.

SUMMARY

According to one aspect of the present disclosure, there is provided a method for forming a dummy gate in manufacturing a field effect transistor. The method includes a first process of exposing a workpiece having a polycrystalline silicon layer to plasma of HBr gas; and a second process of further exposing the workpiece to the HBr gas plasma after the first process. The first process includes etching the polycrystalline silicon layer to form a dummy semiconductor part having a pair of side surfaces from the polycrystalline silicon layer, and forming a protection film based on a by-product of etching on the pair of side surfaces in such a manner that the thickness of the protection film becomes smaller toward a lower end of the dummy semiconductor part.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 12 is Table 1 in which processing conditions of Test Example 1 and Test Example 2 are listed.

FIG. 13 is a view representing test results (Table 2) of Test Example 1 and Test Example 2.

FIG. 14 is Table 3 in which processing conditions of Test Example 3 and Test Example 4 are listed.

FIG. 15 is a view representing test results (Table 4) of Test Example 3 and Test Example 4.

FIG. 16 is Table 5 in which processing conditions of Test Examples 5 to 7 are listed.

FIG. 19 is Table 7 in which processing conditions of Test Examples 8 to 11 are listed.

FIG. 20 is a view representing test results (Table 8) of Test Examples 8 to 11.

FIG. 22 is Table 9 in which processing conditions of Test Examples 12 to 14 are listed.

FIG. 23 is a view representing test results (Table 10) of Test Examples 12 to 14.

FIG. 25 is Table 11 in which processing conditions of Test Example 15 and Test Example 16 are listed.

FIG. 26 is a view representing test results (Table 12) of Test Example 15 and Test Example 16.

DETAILED DESCRIPTION

Figure 1:
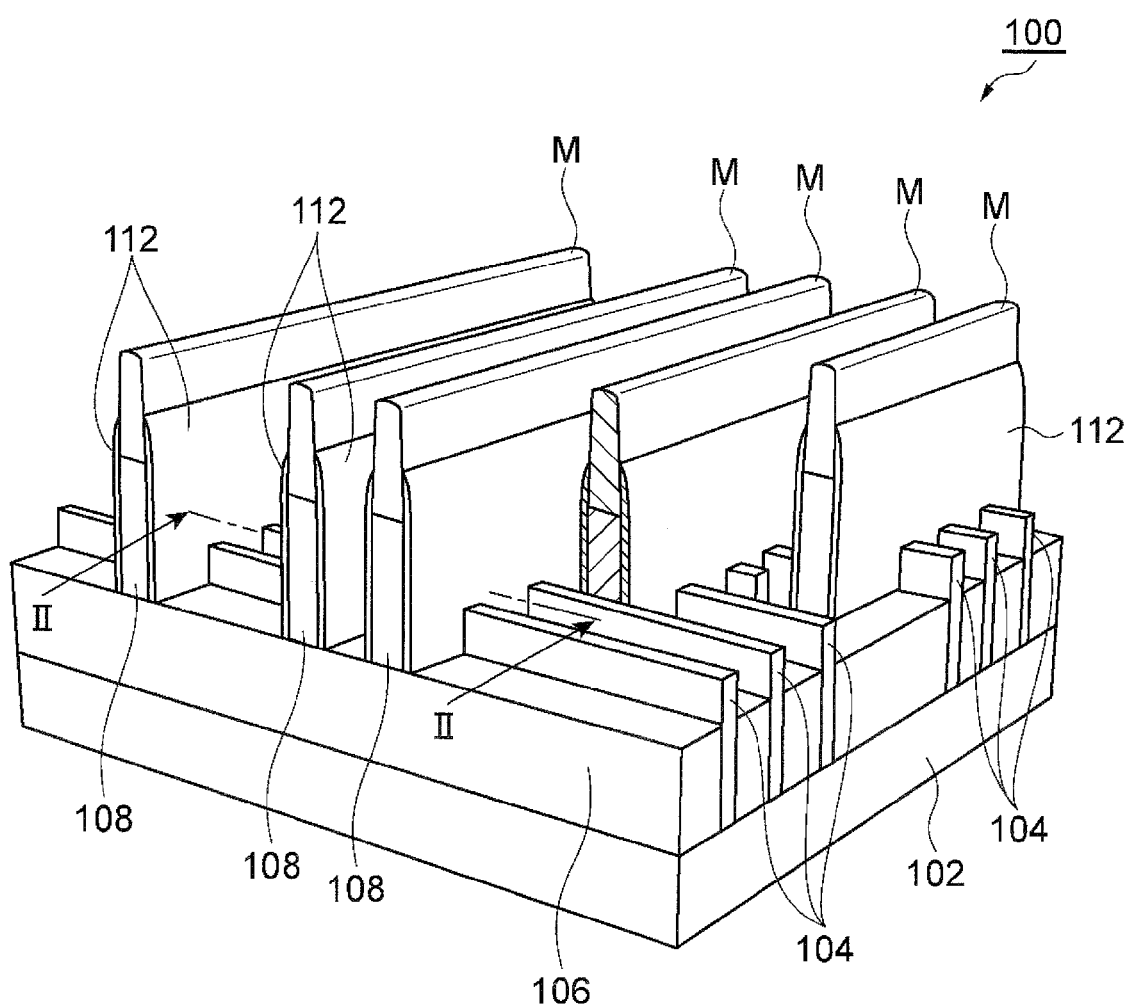
FIG. 1 is a perspective view illustrating a product manufactured in an intermediate stage in manufacturing a general fin type field effect transistor.

In the following detailed description, reference is made to the accompanying drawing, which form a part hereof. The illustrative exemplary embodiments described in the detailed description, drawing, and claims are not meant to be limiting. Other exemplary embodiments may be utilized, and other changes may be made, without departing from the spirit or scope of the subject matter presented here.

An electrical characteristic varies between field effect transistors according to a contact area of a gate electrode with respect to a gate insulation film. In order to suppress the variation, it is required to suppress the contact area of the gate electrode with respect to the gate insulation film from varying between transistors. For this purpose, what is needed is a technology that enables a space surrounded by sidewall spacers to be filled with an electrode material.

An aspect of the present disclosure relates to a method of forming a dummy gate in manufacturing a field effect transistor. The dummy gate forming method includes a first process of exposing a workpiece having a polycrystalline silicon layer to plasma of HBr gas, and a second process of further exposing the workpiece to the HBr gas plasma after the first process. The first process includes etching the polycrystalline silicon layer to form a dummy semiconductor part having a pair of side surfaces from the polycrystalline silicon layer, and forming a protection film based on a by-product of etching on the pair of side surfaces in such a manner that the thickness of the protection film becomes smaller toward a lower end of the dummy semiconductor part. In an exemplary embodiment, the workpiece may be exposed to plasma of a mixed gas of HBr gas and oxygen gas in the first process.

In the method described above, in the first process, the polycrystalline silicon layer is etched until etching substantially reaches a surface of an underlying layer by exposing the workpiece to the HBr gas plasma. As a result, a dummy semiconductor part made of the polycrystalline silicon is formed. Later, the dummy semiconductor part will be used as a dummy gate. The etching in the first process is progressed while a chemical compound containing Si and Br that is by-products of etching is deposited on a pair of side surfaces of the dummy semiconductor part. The protection film formed when the chemical compound is deposited on the pair of side surfaces is formed in such a manner that a film thickness thereof is thicker at an upper portion of the dummy semiconductor part and becomes smaller toward a lower end of the dummy semiconductor part. In addition, in the second process, when the workpiece is further exposed to the HBr gas plasma, lateral etching is progressed. Here, because the protection film formed on the upper portion of the dummy semiconductor part is thicker, the dummy semiconductor part is not laterally etched or a lateral etching amount of the dummy semiconductor part becomes small. Meanwhile, because the protection film formed on the bottom portion of the dummy semiconductor part is thin, the bottom portion of the dummy semiconductor part is laterally etched. Further, because the thickness of the protection film also becomes smaller toward the lower end of the dummy semiconductor part also at the bottom portion, at least of a portion of the bottom portion of the dummy semiconductor part, that is, a portion from the lower end to a predetermined height of the dummy semiconductor part has a tapered shape in which a distance between the pair of side surfaces becomes smaller toward the lower end of the dummy semiconductor part. When the dummy semiconductor part formed as described above is used as a dummy gate, a space surrounded by sidewall spacers, that is, a space defined by the sidewall spacers after removing the dummy gate has a width which becomes narrower toward the lower portion. Such a space may be easily filled with an electrode material.

In an exemplary embodiment of the present disclosure, the method described above further includes a third process in which the workpiece is further exposed to plasma of bromine gas or chlorine gas after the second process. In an exemplary embodiment, plasma of bromine gas or chlorine gas, which does not contain oxygen gas, may be generated in the third process. Typically, a field effect transistor includes an insulation layer made of $SiO_2$. Accordingly, plasma of a gas having selectivity to a polycrystalline silicon layer with respect to the insulation layer needs to be generated upon etching the dummy semiconductor part. The plasma of bromine gas or chlorine gas selectively etches the dummy semiconductor part without substantially etching the insulation layer. Further, the deposition property of the gas used in the third process is poor and deposition property of the by-product of etching is also low. Accordingly, as the result of etching in the third process, the pair of side surfaces become smoother surfaces.

In an exemplary embodiment, the plasma may be generated by microwave. When the microwave is used as a plasma source, a production efficiency of radicals and controllability of a production amount of radicals may be improved as compared to a case where other plasma source used in a parallel plate type plasma processing apparatus is used. As a result, the production efficiency of the by-product of etching may be improved and the controllability of a production amount of the by-product of etching may be improved. Accordingly, the controllability of an adhesion amount of the by-product of etching on the dummy semiconductor part may be improved and further, the controllability of a shape of the dummy semiconductor part may be improved.

In an exemplary embodiment, a field effect transistor may be a fin type field effect transistor. In this case, the workpiece has one or more fin type semiconductor parts, the polycrystalline silicon layer is provided to cover the one or more fin type semiconductor parts, and the dummy semiconductor part is formed to extend in a direction intersecting with the one or more fin type semiconductor parts. Here, a large amount of silicon which becomes the source of the by-product of etching exists above the fin type semiconductor parts. However, a relatively smaller amount of silicon exists below the fin type semiconductor parts due to existence of the fin type semiconductor parts. Accordingly, the protection film formed based on the by-product of etching is prone to be formed thinner on the lower portion than on the upper portion of the fin type semiconductor parts. Accordingly, the method described above is suitable for forming a dummy gate in manufacturing a fin type field effect transistor. Further, it becomes possible to provide a tapered shape of a dummy semiconductor part, in which a distance between the pair of side surfaces becomes smaller toward the lower end of the dummy semiconductor part, at a portion lower than a fin type semiconductor part.

In an exemplary embodiment, oxygen gas plasma is generated together with the HBr gas plasma in the first process in the method described above.

As described above, according to an aspect and various exemplary embodiments of the present disclosure, there is provided a dummy gate forming method which enables a space surrounded by sidewall spacers to be filled with an electrode material.

Hereinafter, various exemplary embodiments will be described with reference to accompanying drawings. Further, similar or corresponding portions in the drawings will be given similar reference numerals.

First, descriptions will be made on manufacturing a general fin type field effect transistor. FIG. 1 is a perspective view illustrating a product manufactured in an intermediate stage in manufacturing a general fin type field effect transistor. A manufactured product 100 illustrated in FIG. 1 includes a substrate 102 made of silicon. A plurality of semiconductor parts 104 are provided on a surface of the substrate 102. The plurality of semiconductor parts 104 are fin type semiconductor parts which are provided in parallel and extend in the same direction. The plurality of semiconductor parts 104 are made of the same material as the substrate 102. The plurality of semiconductor parts 104 are formed by etching the semiconductor substrate made of silicon, for example.

An insulation layer 106 is provided between the plurality of semiconductor parts 104. The insulation layer 106 is made of $SiO_2$ and provided to cover the plurality of semiconductor parts 104 to an intermediate position in the height direction thereof. The insulation layer 106 is formed by, for example, forming a $SiO_2$ layer on the substrate 102 to cover the plurality of semiconductor parts 104 and etching back the $SiO_2$ layer.

Further, the product 100 includes a plurality of dummy gates 108. The dummy gates 108 extend in a direction orthogonal to the plurality of semiconductor parts 104 and partially cover the plurality of semiconductor parts 104 and the insulation layer 106. The plurality of dummy gates 108 are formed by providing a polycrystalline silicon layer to cover the plurality of semiconductor parts 104 and the insulation layer 106, providing a mask M on the polycrystalline silicon layer, and etching the polycrystalline silicon layer to transfer a pattern of the mask M. The mask M may have a multi-layered structure of, for example, a SiN layer and a $SiO_2$ layer.

Further, the product 100 includes sidewall spacers 112. The sidewall spacers 112 are provided along a pair of side surfaces of each of the dummy gates 108. The sidewall spacers 112 are made of, for example, SiN.

Figure 2A:
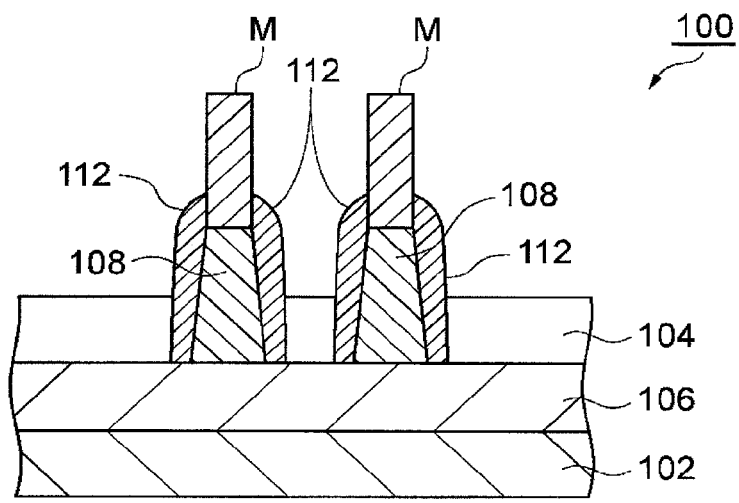
FIGS. 2A and 2B are cross-sectional views taken along a line II-II of FIG. 1 illustrating the product in a state where the dummy gates are formed through a conventional etching method of a general polycrystalline silicon layer and a state where the dummy gates are removed, respectively.
Figure 2B:
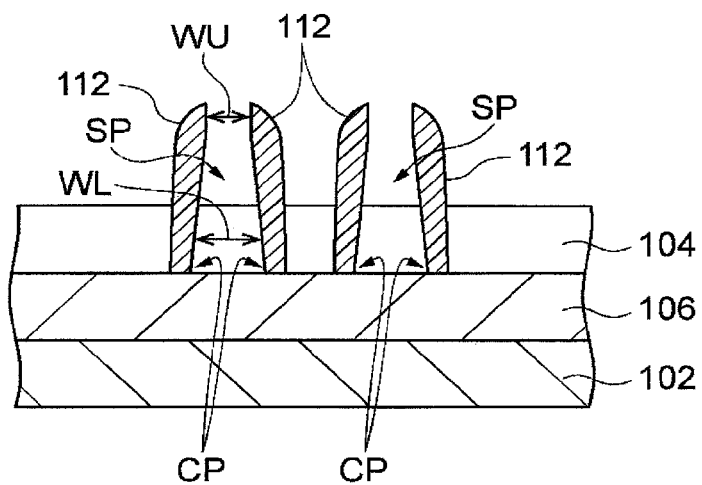

FIGS. 2A and 2B are cross-sectional views taken along a line II-II of FIG. 1 illustrating the product in a state where the dummy gates are formed through a conventional etching method of a general polycrystalline silicon layer and a state where the dummy gates are removed, respectively. As illustrated in FIG. 2A, a width between the pair of side surfaces of each dummy gate 108 generally becomes larger toward the insulation layer 106, that is, toward lower end of the dummy gate 108. As such, the conventional dummy gate 108 generally has a reversed tapered shape. A space SP formed by removing the dummy gate 108 having the reversed tapered shape has a shape as illustrated in FIG. 2B. That is, as illustrated in FIG. 2B, the spacing between each pair of sidewall spacers 112 which define the space SP becomes larger toward a lower portion. More specifically, a width WL of the space SP at a given position in the height direction is larger than a width WU of the space SP at any position above the given position. When the electrode material is supplied into the space SP, the space SP may not be filled with the electrode material. Specifically, the electrode material may not be filled to a corner portion CP of the space SP, that is, a portion located in the vicinity of a contact position between the surface of the insulation layer 106 and the sidewall spacers 112.

Figure 3:
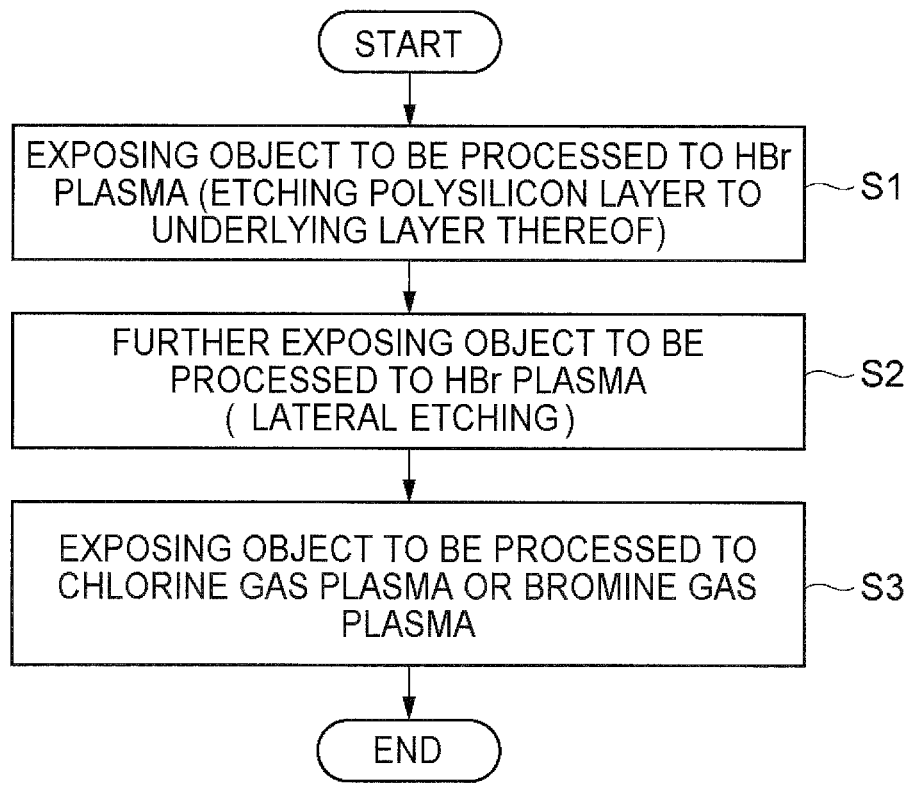
FIG. 3 is a flowchart illustrating a dummy gate forming method according to an exemplary embodiment of the present disclosure.

The dummy gate forming method according to an exemplary embodiment of the present disclosure may solve the problems described above with reference to FIGS. 2A and 2B may facilitate the filling of the electrode material in the spaces formed by removing the dummy gates. FIG. 3 is a flowchart illustrating a dummy gate forming method according to an exemplary embodiment of the present disclosure. Hereinafter, an exemplary embodiment of a dummy gate forming method in manufacturing a fin type field effect transistor will be described with reference to FIG. 3.

Figure 4:
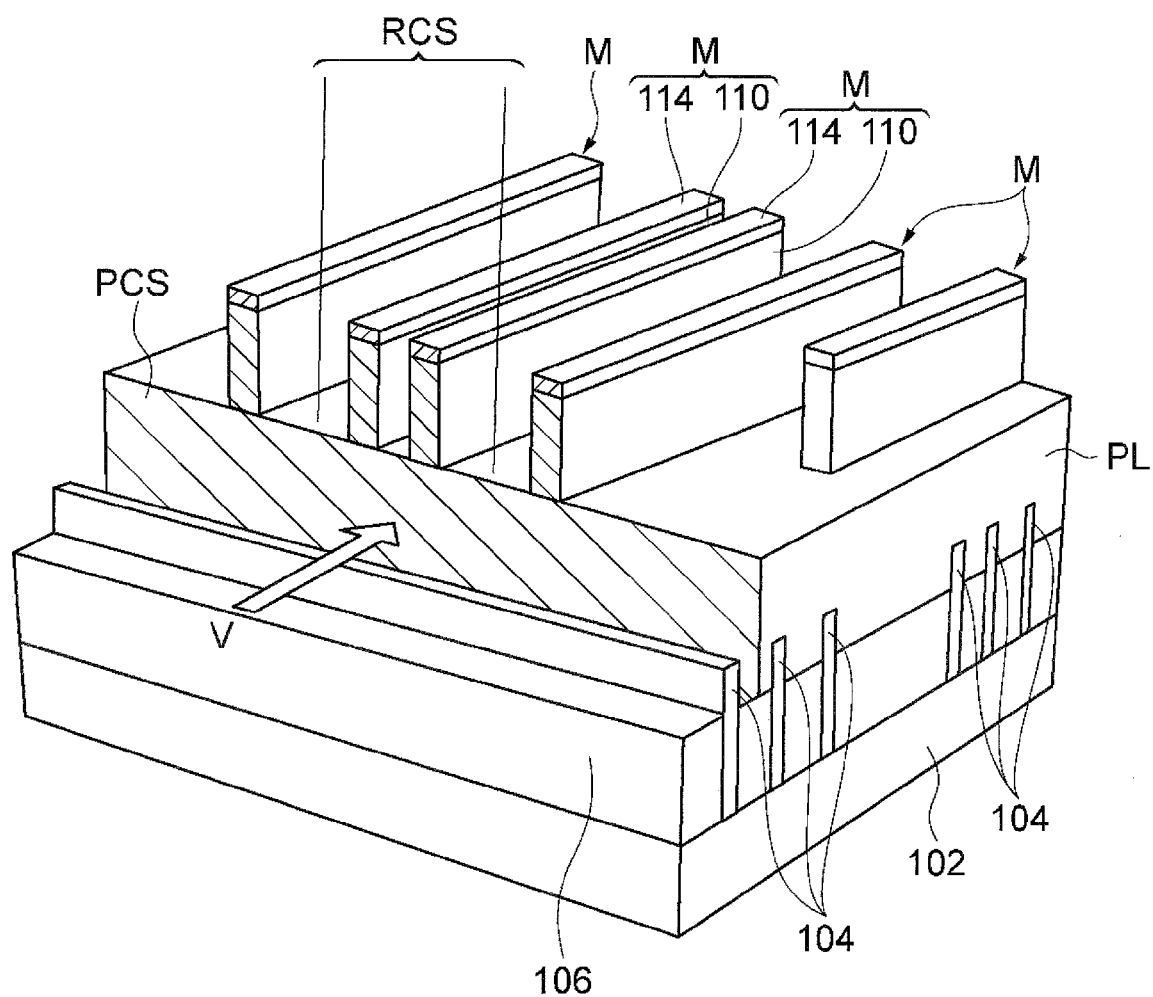
FIG. 4 is a partially cut-away perspective view illustrating a workpiece prepared in the dummy gate forming method according to the exemplary embodiment.

In the dummy gate forming method according to the exemplary embodiment, a workpiece W is prepared first. FIG. 4 is a partially cut-away perspective view illustrating the workpiece prepared in the dummy gate forming method according to the exemplary embodiment. FIG. 4 illustrates the workpiece W in which a polycrystalline silicon layer PL and a mask M are partially cut away between two neighboring semiconductor parts 104 and a cut-away section PCS of the polycrystalline silicon layer PL is illustrated in the figure.

As illustrated in FIG. 4, the workpiece W includes a substrate 102, a plurality of semiconductor parts 104, an insulation layer 106, and a polycrystalline silicon layer PL. The substrate 102 is a substrate made of silicon as described above. The plurality of fin type semiconductor parts 104 are formed on a surface of the substrate 102.

The insulation layer 106 made of $SiO_2$ is provided between the plurality of semiconductor parts 104. The semiconductor parts 104 and the insulation layer 106 are formed by the same method as the conventional method described above. Further, the polycrystalline silicon layer PL is provided on the semiconductor parts 104 and the insulation layer 106 to cover the semiconductor parts 104 and the insulation layer 106. The polycrystalline silicon layer PL is formed using a chemical vapor deposition (CVD) process. The mask M is formed on the polycrystalline silicon layer PL. The mask M has a pattern to be transferred onto the polycrystalline silicon layer PL. In the exemplary embodiment, the mask M may have a multi-layer structure in which the second layer 114 made of $SiO_2$ is provided on the first layer 110 made of SiN.

In the method illustrated in FIG. 3, processes S1 to S3 are performed on the workpiece W illustrated in FIG. 4. Hereinafter, FIGS. 5 to 7 will be referred to, in addition to FIGS. 3 and 4. FIGS. 5 to 7 are cross-sectional views for explaining each process of a dummy gate forming method according to an exemplary embodiment. Further, in FIGS. 5 to 7, a state of the workpiece W in each process is illustrated using a cross section of an area RCS in the same plane as the plane which includes the cut-away section PCS of FIG. 4 when viewed in a direction indicated by arrow V illustrated in the corresponding drawings.

In the method illustrated in FIG. 3, the workpiece W is accommodated in a processing container of a plasma processing apparatus and exposed to HBr gas plasma in process S1. In process S1, the polycrystalline silicon layer PL is etched so as to transfer the pattern of the mask M onto the polycrystalline silicon layer PL.

Figure 5A:
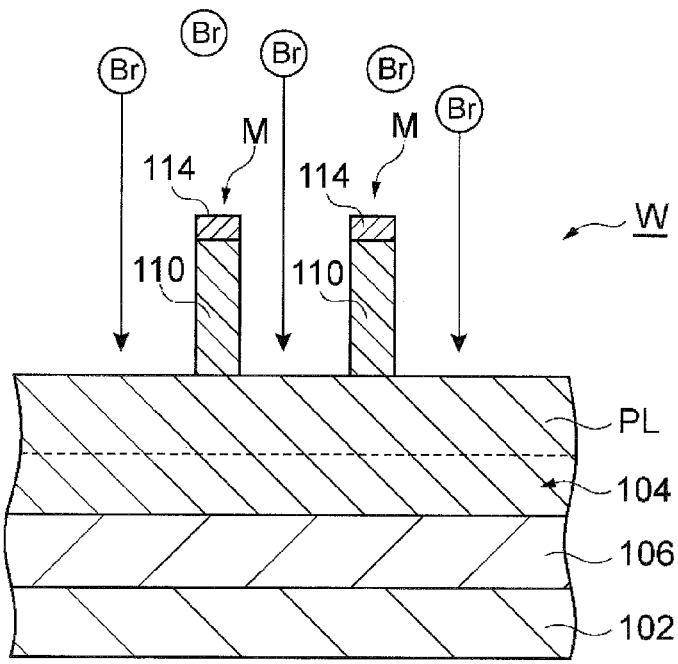
FIGS. 5A and 5B are cross-sectional views for explaining each process of a dummy gate forming method according to an exemplary embodiment.

As illustrated in FIG. 5A, when exciting the HBr gas, activated species such as Br (bromine) radicals are generated. In process S1, the generated activated species of Br are combined with Si (silicon) of the polycrystalline silicon layer PL and thus, the polycrystalline silicon layer PL is etched. Further, in FIG. 5A, an encircled "Br" indicates an activated species of Br.

Figure 5B:
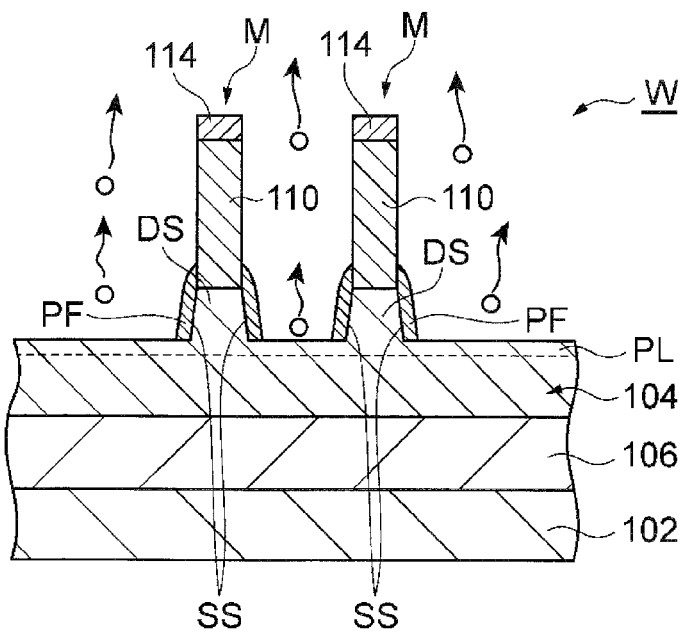

As illustrated in FIG. 5B, in process S1, as the etching of the polycrystalline silicon layer PL is progressed, dummy semiconductor parts DS are gradually formed from the polycrystalline silicon layer PL. The pattern of the mask M is reflected in the shape of each dummy semiconductor part DS which has a pair of side surfaces SS.

Further, the etching performed using the HBr gas plasma in process S1 is not ion assisted etching but reactive ion etching which is isotropic etching. Accordingly, in process S1, the polycrystalline silicon layer PL is etched while forming a protection film on the side surfaces of each dummy semiconductor part DS formed from the polycrystalline silicon layer PL.

In the exemplary embodiment, in process S1, $O_2$ gas and Ar gas may be supplied into the processing container inside the plasma processing apparatus together with the HBr gas. In process S1, SiBrO, which is a chemical compound produced when Si, Br, and O (oxygen) are bonded to each other, that is, a by-product of etching is deposited on the pair of side surfaces SS of each dummy semiconductor part DS. In this way, the protection film PF is formed on the pair of side surfaces SS of the dummy semiconductor part DS. Further, SiO which is a chemical compound of Si and O may be included at a portion of the protection film PF.

Figure 6A:
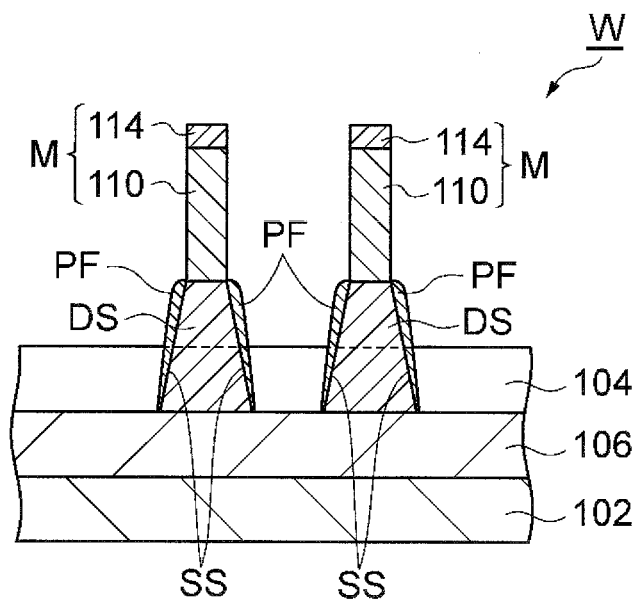
FIGS. 6A and 6B are cross-sectional views for explaining each process of the dummy gate forming method according to the exemplary embodiment.

In process S1, the etching of the polycrystalline silicon layer PL is progressed until it reaches the insulation layer 106 which is an underlying layer of the polycrystalline silicon layer PL. The cross-section of the workpiece W has a structure illustrated in FIG. 6A upon completing process S1. That is, through process S1, the polycrystalline silicon layer PL is etched and the dummy semiconductor parts DS are formed until the semiconductor parts 104 and the insulation layer 106 are exposed, as illustrated in FIG. 6A. Further, the protection film PF is formed on the pair of side surfaces SS of each of the dummy semiconductor parts DS.

As illustrated in FIG. 6A, the protection film PF is formed thicker at an upper portion of each dummy semiconductor part DS and to become thinner as toward the lower end of the dummy semiconductor part DS. This is because a relatively large amount of activated species of, for example, Br and O, is supplied to the upper portion of the dummy semiconductor part DS and a supplied amount of activated species becomes smaller as toward the lower end of the dummy semiconductor part DS. Further, in the workpiece W including the fin type semiconductor parts 104, a relatively large amount of Si exists above the semiconductor parts 104, but the amount of Si is reduced below the semiconductor parts 104 due to existence of the semiconductor parts 104. As a result, the film thickness of the protection film PF formed on the pair of side surfaces SS of each dummy semiconductor part DS remarkably tends to become thicker at an upper portion of the dummy semiconductor part DS and to become thinner toward the lower end.

Subsequently, in the present method, as illustrated in FIG. 3, the workpiece W is further exposed to the HBr gas plasma in process S2. Also, in process S2, $O_2$ gas and Ar gas may be supplied into the processing container inside the plasma processing apparatus together with HBr gas. In the previous process S1, the polycrystalline silicon layer PL is etched to the underlying layer thereof. Thus, in process S2, a reduced amount of silicon is generated by etching and a considerably reduced amount of the by-product is generated in the etching which may be the source of the protection film PF. Accordingly, the etching is progressed laterally in process S2. Further, the protection film PF and the dummy semiconductor parts DS are selectively etched in process S2.

Figure 6B:
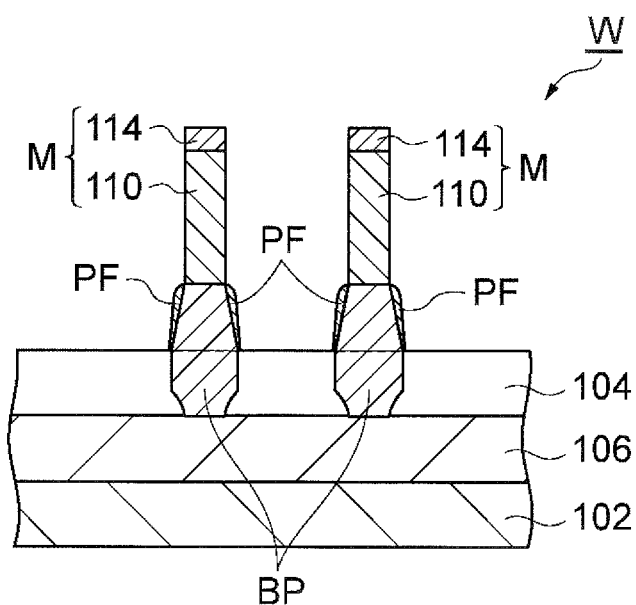

Specifically, since a thick protection film is formed on the upper portion of each dummy semiconductor part DS, a relatively small amount of the dummy semiconductor part DS is laterally etched at the upper portion. For example, at the upper portion of the dummy semiconductor part DS, the protection film PF is laterally etched. Thus, the dummy semiconductor parts DS is not substantially etched or is slightly etched. Meanwhile, since a thin protection film is formed on the bottom portion BP of the dummy semiconductor part DS, a relatively large amount of the dummy semiconductor part DS is laterally etched at the bottom portion BP. That is, the bottom portion BP is also laterally etched in addition to the protection film PF. Accordingly, during process S2, as illustrated in FIG. 6B, for example, the protection film PF remains at the upper portion of the dummy semiconductor part DS and the lateral etching of the upper portion of the dummy semiconductor part DS is not started while the lateral etching of the bottom portion BP of the dummy semiconductor part DS is progressed.

Figure 7A:
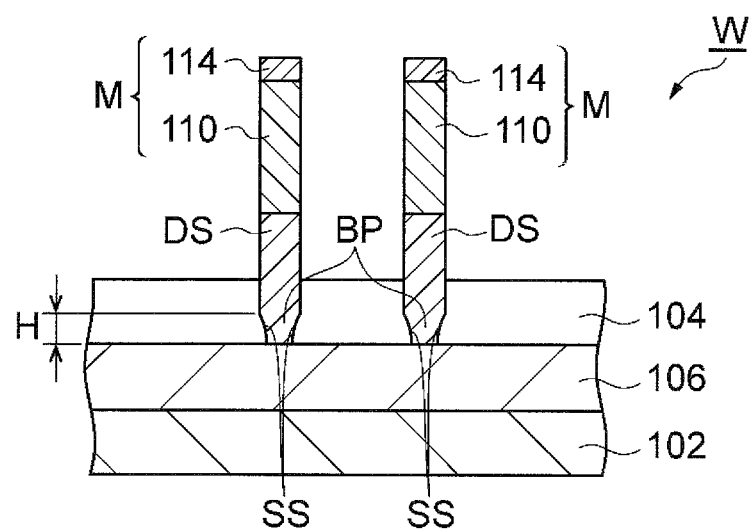
FIGS. 7A and 7B are cross-sectional views for explaining each process of the dummy gate forming method according to the exemplary embodiment.

Further, the thickness of the protection film PF becomes smaller toward the lower end of each dummy semiconductor part DS. Therefore, the laterally etched amount becomes larger toward the lower end at the bottom portion BP. As a result, upon completing process S2, at the bottom portion BP of each dummy semiconductor part DS, the distance between the pair of side surfaces SS becomes smaller toward the lower end of the dummy semiconductor part DS at the bottom portion BP of the dummy semiconductor part DS as illustrated in FIG. 7A. Accordingly, the bottom portion BP of each dummy semiconductor part DS has a tapered shape at a portion from the lower end to a certain position in the height direction. Further, it becomes possible to provide the tapered shape of the bottom portion BP of the dummy semiconductor part DS below the top portion of the semiconductor part 104 in the workpiece W including a fin type semiconductor part 104.

When a dummy semiconductor part DS having the above-described shape is used as a dummy gate, the space formed between the sidewall spacer layers after removing the dummy gate becomes a shape that may be easily filled with an electrode material. In particular, because the insulation layer 106 and each of the corner portions of the space surrounded by the sidewall spacers form an obtuse angle, the electrode material may be easily supplied to the corner portions.

Figure 7B:
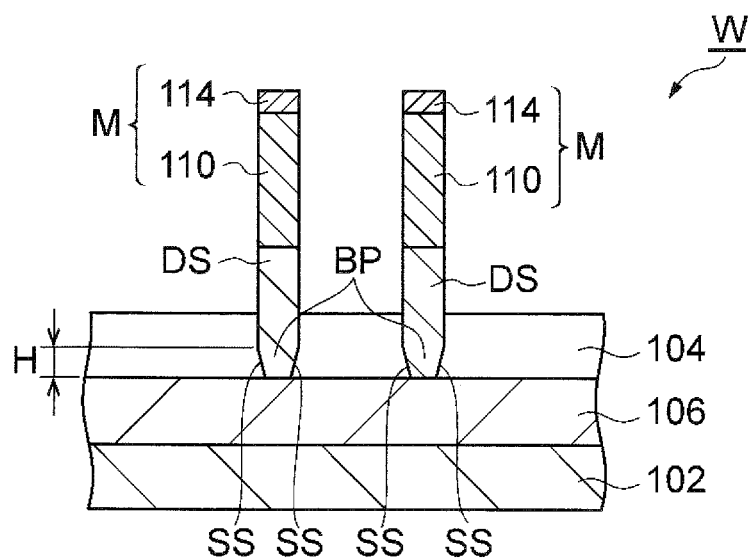

In an exemplary embodiment, process S3 may be further performed after process S2 without using the dummy semiconductor parts DS formed through process S2 as the dummy gates. The workpiece W is exposed to the plasma of chlorine gas ($Cl_2$ gas) or bromine gas ($Br_2$ gas) within the processing container of the plasma processing apparatus in process S3. Oxygen gas is not supplied into the processing container in process S3. As such, the chlorine gas or the bromine gas which is poor in deposition property compared to HBr gas is used in process S3. Further, the by-product of etching generated in process S3 is poor in deposition property. Accordingly, the lateral etching of the bottom portion BP of each dummy semiconductor part DS is further progressed in process S3. As a result, as illustrated in FIG. 7B, the pair of side surfaces SS of the bottom portion BP formed in process S3 become smoother than the pair of side surfaces SS formed in process S2.

Further, the gas used in process S3 is halogen gas, but is not fluorine gas. The reason is that the fluorine gas etches the insulation layer 106 since the fluorine gas does not have selectivity with respect to the dummy semiconductor parts DS although the fluorine gas may etch the dummy semiconductor parts DS made of polycrystalline silicon. Accordingly, in process S3, the dummy semiconductor parts DS may also be selectively etched.

Figure 8A:
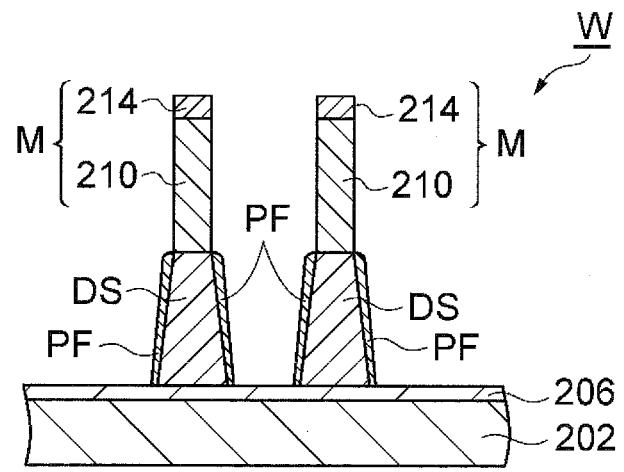
FIGS. 8A to 8C are views illustrating a state of the workpiece after each process when the method illustrated in FIG. 3 is used in manufacturing a planar type field effect transistor.
Figure 8B:
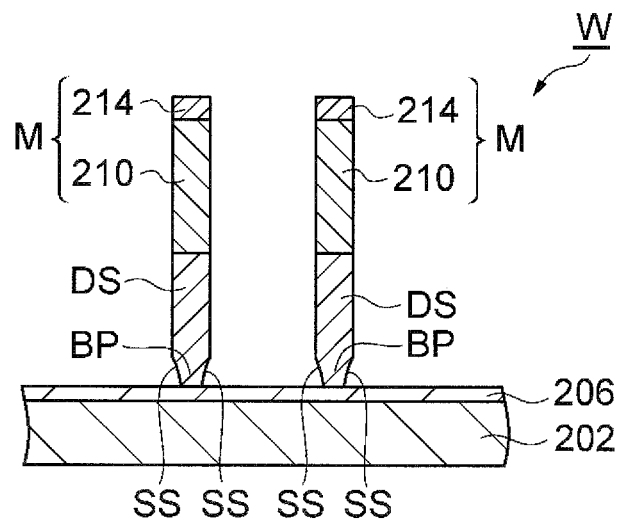
Figure 8C:
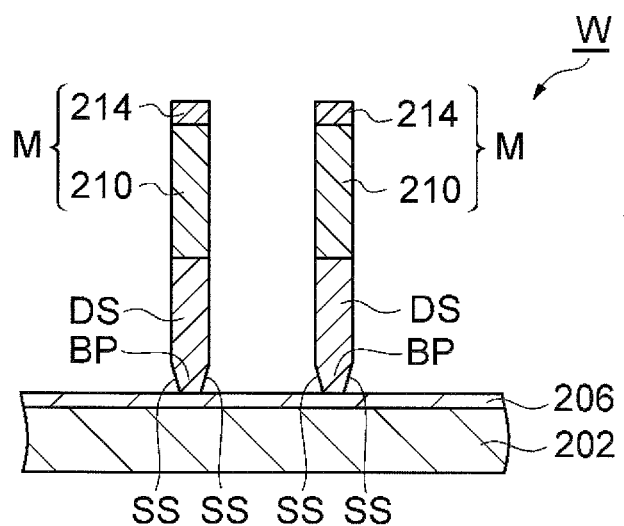

Next, reference will be made to FIGS. 8A to 8C. FIGS. 8A to 8C are views illustrating a state of the workpiece after each process when the method illustrated in FIG. 3 is used in manufacturing a planar type field effect transistor. The method illustrated in FIG. 3 is not limited to manufacturing a fin type field effect transistor but may also be used in manufacturing a planar type field effect transistor.

As illustrated in FIG. 8A, in manufacturing a planar type field effect transistor, an insulation film 206 made of $SiO_2$ is formed on a surface of a substrate 202 made of Si and a polycrystalline silicon layer is etched in order to transfer a pattern of a mask M on the polycrystalline silicon layer provided on the insulation film 206. Therefore, dummy semiconductor parts DS are formed on the insulation film 206. Further, the mask M used in manufacturing the planar type field effect transistor may have a multi-layer structure which includes a first layer 210 made of $SiO_2$ and a second layer 214 made of SiN and formed on the first layer 210.

Also, in manufacturing the planar type field effect transistor, in process S1, the polycrystalline silicon layer provided on the insulation film 206 is etched until the etching reaches the surface of the insulation film 206 which is an underlying layer of the polycrystalline silicon layer. Also, in manufacturing the planar type field effect transistor the film thickness of the protection film PF formed on side surfaces SS of each dummy semiconductor part DS in process S1 tends to become smaller toward the lower end from the upper end of the dummy semiconductor part DS. However, in manufacturing a planar type field effect transistor, a fin type semiconductor part is not provided. Thus, the tendency regarding the film thickness of the protection film PF in a planar type field effect transistor as described above is not remarkable as compared to the tendency regarding the film thickness of the protection film PF in a fin type field effect transistor.

Also, in process S2, the workpiece W illustrated in FIG. 8A is further exposed to the HBr plasma and thus, the bottom portions BP of the dummy semiconductor parts DS are laterally etched. As a result, as illustrated in FIG. 8B, the distance between the pair of side surfaces SS of each dummy semiconductor part DS becomes smaller toward the lower end of the dummy semiconductor part DS at the bottom portion BP. Further, when process S3 is further performed, the pair of side surfaces SS become smoother surface at the bottom portion BP as illustrated in FIG. 8B.

In the method illustrated in FIG. 3, a lateral etching amount of the bottom portion BP of each dummy semiconductor part DS may be adjusted by adjusting a time for process S2. That is, the lateral etching amount of the bottom portion BP of each dummy semiconductor part DS may be increased as the time for the process S2 is increased.

In the method illustrated in FIG. 3, when a temperature of the workpiece W during performing process S1 is adjusted, the film thickness of the protection film PF may be adjusted. This is because an adhesion probability (an adhesion coefficient) of the by-product of etching with respect to the dummy semiconductor parts DS is reduced as the temperature of the workpiece W is increased. Further, when the temperature of the workpiece W during performing process S2 is adjusted, the etching rate of the dummy semiconductor parts DS, especially, the lateral etching rate of the dummy semiconductor parts DS in process S2 may be adjusted. This is because the etching rate of the dummy semiconductor part DS is increased as the temperature of the workpiece W is increased. For example, the temperature of the workpiece W may be set in a range of temperature from 60° C. to 70° C. in process S1 and process S2.

Further, in the method illustrated in FIG. 3, when the flow rate of HBr gas and the flow rate of $O_2$ gas in process S1 are relatively adjusted a height (see, e.g., "H" in FIGS. 7A and 7B) of a portion where the tapered shape is prepared, that is, a distance from the lower end of each dummy semiconductor part DS to a height position where the tapered shape is terminated (hereinafter, referred to as "the height of the tapered shape") may be adjusted. Specifically, when the flow rate of HBr gas is decreased and the flow rate of $O_2$ gas is increased, an increased amount of a chemical compound which corresponds to the by-product of etching described above is produced. Therefore, the thickness of the protection film PF becomes thicker. When the processing time for the process S2 is increased in order to remove the protection film PF, lateral etching is progressed at each bottom portion BP where the thickness of the protection film PF is thin and the height of the portion where each tapered shape is prepared is increased in proportion to the progression of the lateral etching. As described above, when the flow rate of HBr gas and the flow rate of $O_2$ gas in the process S1 are relatively adjusted, the height of the portion where each tapered shape is prepared may be adjusted in the method illustrated in FIG. 3.

Further, in an exemplary embodiment, plasma may be generated using microwave as the plasma source in processes S1 to S3 described above. For example, a gas within the processing container may be excited in each of processes S1 to S3 using microwave emitted from a radial line slot antenna. The plasma processing apparatus using microwave may further improve the production efficiency of radicals and controllability of the production amount of radicals as compared with the parallel plate type plasma processing apparatus. As a result, the production efficiency of a by-product of etching may be improved and further, the controllability of the production amount of the by-product of etching may be improved. Accordingly, the controllability of an adhesion amount of the by-product of etching in relation to the dummy semiconductor parts DS may be improved and further, the controllability of the shape of the dummy semiconductor parts DS may also be improved.

When microwave is used as a plasma source, the height of the tapered shape may be adjusted by controlling the power of microwave in the method illustrated in FIG. 3. Specifically, when the power of microwave is adjusted, an amount of a chemical compound which corresponds to the by-product of etching may be adjusted. As a result, the thickness of the protection film PF may be adjusted. In this way, a degree of progression of lateral etching in process S2 may be adjusted and further, the height of the portion where the tapered shape is prepared may be adjusted. As described above, in the method illustrated in FIG. 3, when the power of microwave in process S1 is adjusted, the height of the tapered shape described above may be adjusted. For example, the power of microwave may be adjusted in the range of 1700 W to 2300 W.

Figure 9:
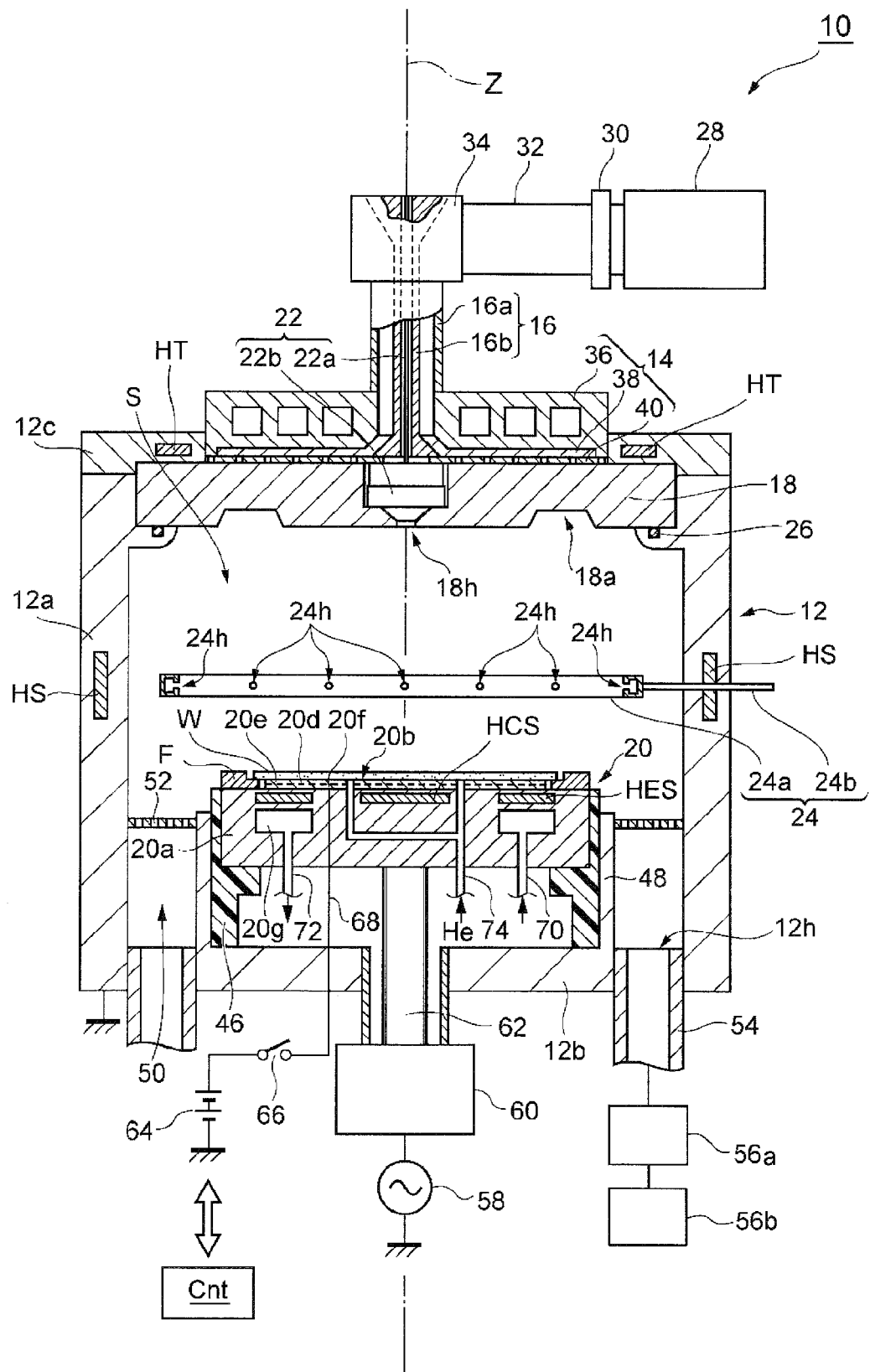
FIG. 9 is a schematic view illustrating a plasma processing apparatus that may be used for performing the dummy gate forming method according to an exemplary embodiment.

Hereinafter, descriptions will be made on an example of a plasma processing apparatus which may be used for performing a dummy gate forming method according to an exemplary embodiment and uses microwave as a plasma source. FIG. 9 is a schematic view illustrating the plasma processing apparatus that may be used for performing a dummy gate forming method according to an exemplary embodiment. FIG. 9 schematically illustrates a cross-section of the plasma processing apparatus 10.

The plasma processing apparatus 10 illustrated in FIG. 9 includes a processing container 12. The processing container 12 defines a space S for accommodating a workpiece W. The processing container 12 may include a sidewall 12a, a bottom portion 12b, and a ceiling portion 12c. The sidewall 12a has a substantially cylindrical shape which extends in a direction (hereinafter, referred to as a "Z-axis direction") to which the Z-axis extends. The bottom portion 12b is provided at a lower end side of the sidewall 12a. An exhaust hole 12h configured to exhaust a gas is formed in the bottom portion 12b. An upper end portion of the sidewall 12a is open. An opening of the upper end portion of the sidewall 12a is closed by a dielectric window 18. The dielectric window 18 is gripped between the upper end portion of the sidewall 12a and the ceiling portion 12c. The sealing member 26 may be interposed between the dielectric window 18 and the upper end portion of the sidewalls 12a. The sealing member 26 is, for example, an O ring, and contributes to the hermetic sealing of the processing container 12.

The plasma processing apparatus 10 further includes a stage 20 provided within the processing container 12. The stage 20 is provided under the dielectric window 18. The stage 20 includes a holding table 20a and an electrostatic chuck 20b.

The holding table 20a is supported by a cylindrical support 46. The cylindrical support 46 is made of an insulating material and extends vertically upward from the bottom portion 12b. Further, a conductive cylindrical support 48 is provided on an outer periphery of the cylindrical support 46. The cylindrical support 48 extends vertically upward from the bottom portion 12b of the processing container 12 along the outer periphery of the cylindrical support 46. An annular exhaust passage 50 is formed between the cylindrical support 48 and the sidewall 12a.

An annular baffle plate 52 formed with a plurality of through-holes is attached to the upper portion of the exhaust passage 50. The exhaust passage 50 is connected to an exhaust pipe 54 which provides an exhaust hole 12h, and an exhaust apparatus 56b is connected to the exhaust pipe 54 through a pressure regulator 56a. The exhaust apparatus 56b includes a vacuum pump such as a turbo molecular pump. A pressure regulator 56a adjusts a flow rate of exhaust gas of the exhaust apparatus 56b to adjust pressure inside the processing container 12. The processing space S within the processing container 12 may be depressurized to a desired vacuum level by the pressure regulator 56a and the exhaust apparatus 56b. Further, when the exhaust apparatus 56b is operated, the gas may be exhausted through the exhaust passage 50 from an outer periphery of the stage 20.

The holding table 20a also functions as a high frequency electrode. A high frequency power supply 58 for RF bias is electrically connected to the holding table 20a through a matching unit 60 and a power feeding rod 62. The high frequency power supply 58 outputs a high frequency power (a bias power) having a prescribed frequency for example, 13.65 MHz, which is adequate for controlling the energy of ions drawn into the workpiece W at a predetermined power. The matching unit 60 accommodates a matcher configured to perform an impedance matching between the impedance of the high frequency power supply 58 side and the impedance of a load side such as, for example, the electrode, the plasma, and the processing container 12. A blocking capacitor configured to generate a self-bias voltage is included in the matcher.

The electrostatic chuck 20b is provided on the top surface of the holding table 20a. The top surface of the electrostatic chuck 20b constitutes a placement area on which the workpiece W is placed. The electrostatic chuck 20b maintains the workpiece W by an electrostatic attractive force. A focus ring F which annularly surrounds the circumference of the workpiece W is provided outside in a radial direction of the electrostatic chuck 20b. The electrostatic chuck 20b includes an electrode 20d, an insulation film 20e, and an insulation film 20f. The electrode 20d is made of a conductive film and provided between the insulation film 20e and the insulation film 20f. A high voltage DC power supply 64 is electrically connected to the electrode 20d through a switch 66 and a coated wire 68. The electrostatic chuck 20b may attract and maintain the workpiece W on the top surface thereof by a Coulomb' force generated by the DC voltage applied from the DC power supply 64.

An annular coolant chamber 20g which extends in the circumferential direction is provided inside the holding table 20a. A coolant, for example, cooling water, having a predetermined temperature is circulated and supplied in the coolant chamber 20g through pipings 70 and 72 from a chiller unit. The processing temperature of the workpiece W on the electrostatic chuck 20b may be controlled by the temperature of the coolant. Further, a heat transfer gas from a heat transfer gas supply unit, for example, He gas, is supplied to a space between the top surface of the electrostatic chuck 20b and a rear surface of the workpiece W through a gas supply pipe 74.

The plasma processing apparatus 10 may further include heaters HT, HS, HCS, and HES as a temperature control mechanism. The heater HT is provided within the ceiling portion 12c and extends annularly to surround an antenna 14. Further, the heater HS is provided within the sidewall 12a and extends annularly. The heater HS may be provided at, for example, a position which corresponds to an intermediate portion of the space S in the height direction (that is, the Z-axis direction). The heater HCS is provided within the holding table 20a. The heater HCS is provided below the central portion of the above-described placement area within the holding table 20a, that is, at an area which intersects with the Z-axis. Further, the heater HES is provided within the holding table 20a and extends annularly to surround the heater HCS. The heater HES is provided below the outer peripheral edge of the placement area described above.

Further, the plasma processing apparatus 10 may further include an antenna 14, a coaxial waveguide 16, a dielectric window 18, a microwave generator 28, a tuner 30, a waveguide 32, and a mode converter 34. The microwave generator 28 generates microwave having a frequency of, for example, 2.45 GHz. The microwave generator 28 is connected to an upper portion of the coaxial waveguide 16 through the tuner 30, the waveguide 32, and the mode converter 34. The coaxial waveguide 16 extends along the Z-axis which is the central axis thereof. The coaxial waveguide 16 includes an outer conductor 16a and an inner conductor 16b. The outer conductor 16a has a cylindrical shape extending in the Z-axis direction. The lower end of the outer conductor 16a may be electrically connected to an upper portion of a cooling jacket 36 which has a conductive surface. The inner conductor 16b is provided inside the outer conductor 16a. The inner conductor 16b extends along the Z-axis. The lower end of the inner conductor 16b is connected to the slot plate 40 of the antenna 14.

The antenna 14 may be displaced within the opening formed in the ceiling portion 12c. The antenna 14 includes the dielectric plate 38 and the slot plate 40. The dielectric plate 38 serves to shorten the wavelength of the microwave and has substantially a disk shape. The dielectric plate 38 is made of, for example, quartz or alumina. The dielectric plate 38 is gripped between the slot plate 40 and a lower surface of the cooling jacket 36. Accordingly, the antenna 14 may be configured by the dielectric plate 38, the slot plate 40, and the lower surface of the cooling jacket 36.

Figure 10:
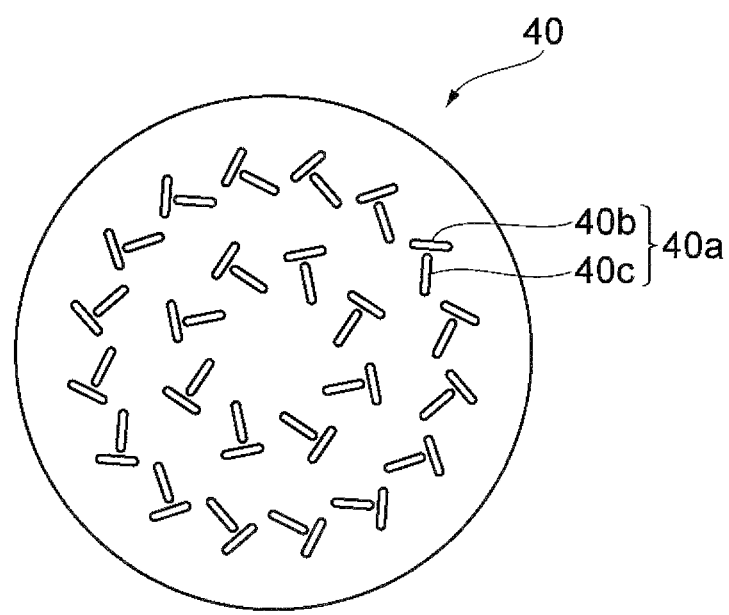
FIG. 10 is a plan view illustrating an example of a slot plate illustrated in FIG. 9.

The slot plate 40 is a substantially disk-shaped metal plate formed with a plurality of slot pairs. The antenna 14 may be a radial line slot antenna. FIG. 10 is a plan view illustrating an example of a slot plate illustrated in FIG. 9. A plurality of slot pairs 40a are formed in the slot plate 40. The plurality of slot pairs 40a are provided in the radial direction at regular intervals and displaced in the circumferential direction at regular intervals. Each of the plurality of slot pairs 40a includes two slots 40b and 40c. The slot 40b and the slot 40c extend in directions which intersect or are orthogonal to each other.

Reference will be made to FIG. 9 again. Microwave generated by the microwave generator 28 is propagated to the dielectric plate 38 through the coaxial waveguide 16 and applied from the slot of the slot plate 40 to the dielectric window 18 in the plasma processing apparatus 10.

The dielectric window 18 has substantially a disk shape and is made of, for example, quartz or alumina. The dielectric window 18 is provided directly below the slot plate 40. The dielectric window 18 transmits microwave received from the antenna 14 so that the microwave is introduced into the processing space S. In this way, an electric field is generated directly below the dielectric window 18 and plasma is generated within the processing space. In this manner, according to the plasma processing apparatus 10, it is possible to generate plasma using microwave without applying a magnetic field.

The bottom surface of the dielectric window 18 may define a recess 18a. The recess 18a is formed annularly around the Z-axis and has a tapered shape. The recess 18a is provided to promote generation of standing wave by the introduced microwave and may contribute to efficient generation of the plasma by microwave.

Figure 11:
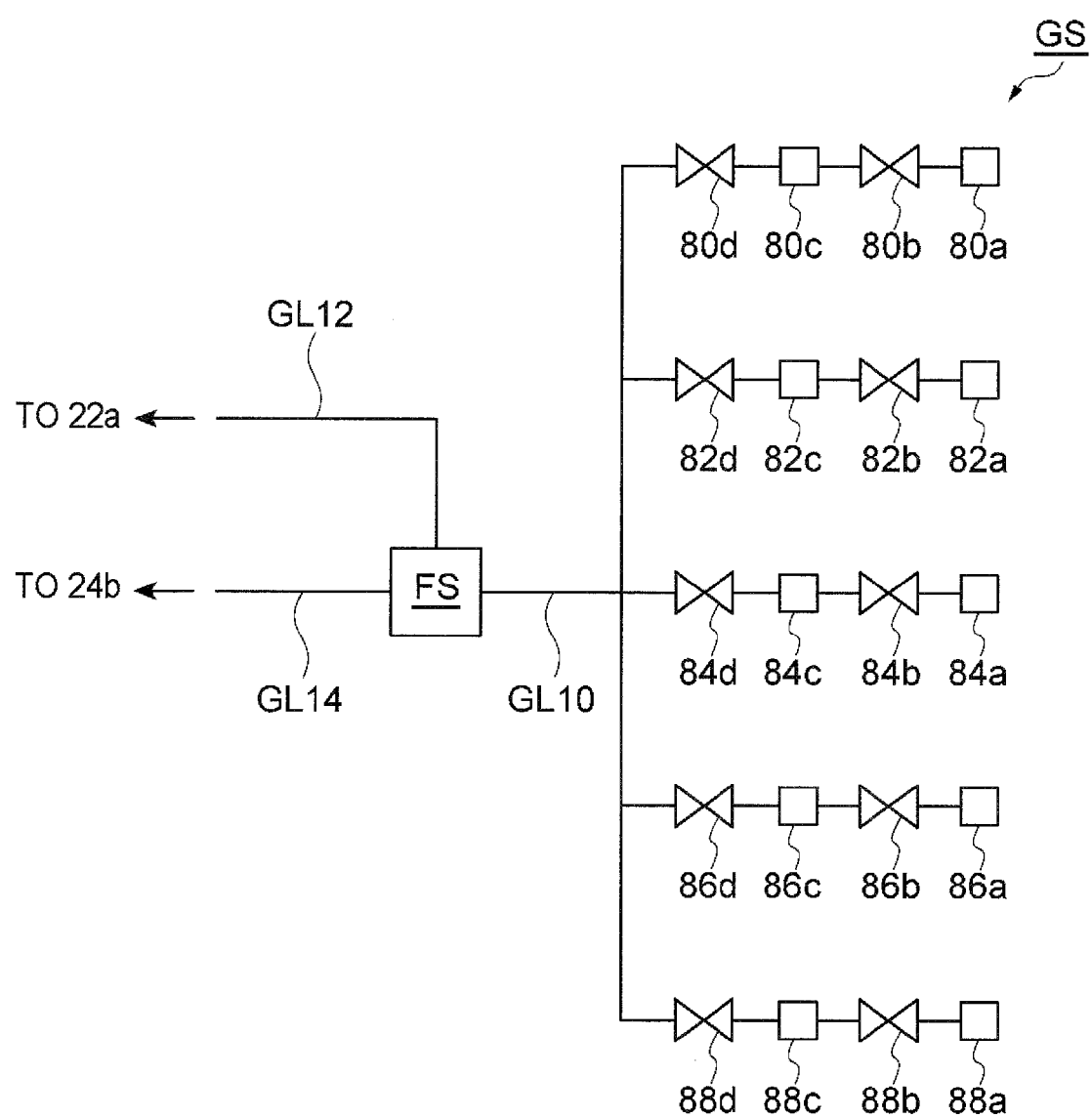
FIG. 11 is a schematic view illustrating a gas supply system of the plasma processing apparatus illustrated in FIG. 9.

Hereinafter, reference will be made to FIG. 11 together with FIG. 9. FIG. 11 is a schematic view illustrating a gas supply system of the plasma processing apparatus illustrated in FIG. 9. As illustrated in FIG. 9 and FIG. 11, the plasma processing apparatus 10 includes a central introduction portion 22, a peripheral introduction portion 24, a flow splitter FS, and a gas supply system GS.

The central introduction portion 22 includes a piping 22a and an injector 22b. The piping 22a extends through the inside of the inner conductor 16b along the Z-axis. The injector 22b is connected to the piping 22a. A plurality of through-holes extending in the Z-axis direction are formed in the injector 22b. A space that accommodates the injector 22b and the hole 18h that connects the space and the processing space S are formed in the dielectric window 18 along the Z-axis. The central introduction portion 22 supplies gas into the processing space S along the Z-axis downwardly from a position above the processing space S through the piping 22a, the plurality of through-holes of the injector 22b, and the hole 18h.

The peripheral introduction portion 24 includes an annular pipe 24a and a piping 24b. The annular pipe 24a is provided within the processing container 12 to extend annularly around the Z-axis at an intermediate position of the processing space S in the Z-axis direction. The annular pipe 24a is formed with a plurality of gas injection holes 24h opened towards the Z-axis. The plurality of gas injection holes 24h are arranged annularly around the Z-axis. The piping 24b is connected to the annular shaped pipe 24a and extends to the outside of the processing container 12. The peripheral introduction portion 24 described above introduces a gas into the processing space S towards the Z-axis through the piping 24b, the annular pipe 24a, and the gas injection hole 24h.

A gas supply system GS supplies a gas to the central introduction portion 22 and the peripheral introduction portion 24. The gas supply system GS includes gas sources 80a, 82a, 84a, 86a and 88a. The gas sources 80a, 82a, 84a, 86a and 88a are a source of Ar gas, a source of HBr gas, a source of $O_2$ gas, a source of $Cl_2$ gas, and a source of $CF_4$ gas, respectively. In addition, the gas source 86a may be a source of $Br_2$ gas. Further, the gas supplied by the gas source 88a is used for removing a natural oxide film formed on the workpiece W before process S1. Accordingly, the gas source 88a may be a source of a fluorocarbon-based gas such as $CF_4$ gas, a source of a fluorohydrocarbon-based gas such as $CH_3F$ gas, or a source of $Cl_2$ gas.

The gas source 80a is connected to a common gas line GL10 through a valve 80b, a mass flow controller 80c, and a valve 80d. The gas source 82a is connected to a common gas line GL10 through a valve 82b, a mass flow controller 82c, and a valve 82d. The gas source 84a is connected to a common gas line GL10 through a valve 84b, a mass flow controller 84c, and a valve 84d. The gas source 86a is connected to a common gas line GL10 through a valve 86b, a mass flow controller 86c, and a valve 86d. Further, the gas source 88a is connected to a common gas line GL10 through a valve 88b, a mass flow controller 88c, and a valve 88d.

The common gas line GL10 is connected to a flow splitter FS. The flow splitter FS branches out a gas supplied from the common gas line GL10 into a gas line GL12 and a gas line GL14. The gas line GL12 is connected to the central introduction portion 22 and the gas line GL14 is connected to the peripheral introduction portion 24. Accordingly, a gas from the gas supply system GS is branched out into the central introduction portion 22 and the peripheral introduction portion 24 by the flow splitter FS. Further, a separate gas supply systems GS may be connected to each of the central introduction portion 22 and the peripheral introduction portion 24 in the plasma processing apparatus 10. With such a configuration, a flow ratio or a composition ratio of the gases supplied from the central introduction portion 22 and the peripheral introduction portion 24 to the processing space S may be spatially controlled in the plasma processing apparatus 10.

The plasma processing apparatus 10 may further include a control unit Cnt as illustrated in FIG. 9. The control unit Cnt may be a programmable controller such as a computer device. The control unit Cnt may transmit a control signal to the mass flow controllers 80c, 82c, 84c, 86c, 88c to control the flow rate of a gas from each of the gas sources 80a, 82a, 84a, 86a and 88a. In addition, the control unit Cnt may transmit a control signal to the valves 80b, 80d, 82b, 82d, 84b, 84d, 86b, 86d, 88b and 88d to control the opening/closing of these valves. Further, the control unit Cnt may transmit a control signal to the flow splitter FS to control a ratio of the amount of the processing gas supplied to the central introduction portion 22 and the amount of the processing gas supplied to the peripheral introduction portion 24, that is, a ratio of the gas flow rate of the central introduction portion 22 and the gas flow rate of the peripheral introduction portion 24. Further, the control unit Cnt may supply a control signal to the microwave generator 28, the high frequency power supply 58, and the pressure regulator 56a so as to control the power of microwave, power and ON/OFF of RF bias and a pressure inside the processing container 12, respectively.

The plasma processing apparatus 10 described above may perform processes S1 to S3 by controlling each unit of the plasma processing apparatus 10 using the control unit Cnt. Further, the plasma processing apparatus 10 uses microwave as the plasma source and thus, may be properly used for performing processes S1 to S3 as described above.

Hereinafter, the dummy gate forming method illustrated in FIG. 3 will be described with reference to various Test Examples performed using the plasma processing apparatus 10 illustrated in FIG. 9.

Test Examples 1 and 2

In Test Example 1 and Test Example 2, dummy gates for a planar type field effect transistor were formed while changing a processing time for process S2 as a parameter. Each of the workpieces W used in Test Example 1 and Test Example 2 included an insulation film 206 made of $SiO_2$ and having a thickness of 10 nm on a silicon substrate 202, included a polycrystalline silicon layer PL having a thickness of 80 nm on the insulation film 206, and included a mask M on the polycrystalline silicon layer PL. The mask M included a first layer 110 made of SiO$_2$ and included a second layer 114 made of SiN on the first layer 110. The thickness of the first layer 110 was 115 nm, the thickness of the second layer 114 was 50 nm, the line width of the mask M was 37 nm, and the inter-line pitch of the mask M was 75 nm. Processing conditions for Test Example 1 and Test Example 2 are listed in Table 1 of FIG. 12. As listed in Table 1, the processing time of process S2 in Test Example 1 was 15 seconds and the processing time of process S2 in the Test Example 2 was 60 seconds. In addition, the frequency of microwave and the frequency of the bias power were 2.45 GHz and 13.65 MHz, respectively. Further, in Test Example 1 and Test Example 2, the pressure of the processing space in process S1 and process S2 was set to 120 mTorr (16 Pa). In Table 1, the processing time "EPD" indicates that the processing time for the corresponding process was determined by detecting a processing end point.

Also, TEM images of the workpieces W after processings of Test Example 1 and Test Example 2 were acquired and shapes of the dummy semiconductor parts DS were obtained from the TEM images. The results are illustrated in FIG. 13 (Table 2). In FIG. 13, the cross-sectional views depict the TEM images as diagrams. Further, "TOP PORTION CD", "INTERMEDIATE CD" and "BOTTOM CD" correspond to a width of an upper end, a width at an intermediate position in the height direction and a width of the lower end of the dummy semiconductor parts DS, respectively. As apparent from the cross-sectional views for the Test Examples 1 and 2 and the bottom portion CD, it was confirmed that the tapered shape may be formed in the bottom portion of the dummy semiconductor part DS by securing a sufficient time for the process S2.

Test Examples 3 and 4

In Test Example 3 and Test Example 4, dummy gates for a planar type field effect transistor were formed while changing a temperature of a stage (temperature of an electrostatic chuck) for processes S1 and S2 as a parameter. The workpieces W used in Test Example 3 and Test Example 4 were the same as those used in Test Example 1 and Test Example 2. Processing conditions for Test Example 3 and Test Example 4 are listed in Table 3 of FIG. 14. As listed in Table 3, the temperature of the stage in process S1 and process S2 of Test Example 3 was set to 60° C. and the temperature of the stage in process S1 and process S2 of Test Example 4 was set to 70° C. In addition, the frequency of microwave and the frequency of bias power were set to 2.45 GHz and 13.65 MHz, respectively. Further, the pressure of the processing space in process S1 and process S2 was set to 120 mTorr (16 Pa) in Test Example 3 and Test Example 4.

Also, SEM images of the workpieces W after the processings of Test Example 3 and Test Example 4 were acquired and shapes of the dummy semiconductor parts DS were obtained from the SEM images. The results are illustrated in FIG. 15 (Table 4). In FIG. 15, the cross-sectional views depict the SEM images as diagrams. As apparent from the cross-sections for Test Example 3 and Test Example 4 and "BOTTOM CD", it was confirmed that tapered shapes may be prepared at the bottom portions of dummy semiconductor parts DS within a short time by increasing the temperature of the stage, that is, the temperature of the workpieces W.

Test Examples 5 to 7

In the Test Examples 5 to 7, dummy gates for a planar type field effect transistor were formed while changing a flow rate of HBr gas and a flow rate of O$_2$ gas for processes S1 as parameters. The workpieces W used in Test Examples 5 to 7 were the same as those used in Test Example 1. Processing conditions for Test Examples 5 to 7 are listed in Table 5 of FIG. 16. In addition, the processing time for process S2 in each of Test Examples 5 to 7 was set to be the same as the processing time for process S1. Further, the frequency of microwave and the frequency of bias power were set to 2.45 GHz and 13.65 MHz, respectively. Further, the pressure of the processing space in process S1 and the process S2 was set to 120 mTorr (16 Pa) in Test Examples 5 to 7.

Figure 17:
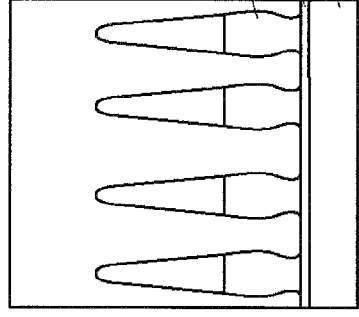
FIG. 17 is a view representing test results (Table 6) of Test Examples 5 to 7.
Figure 18:
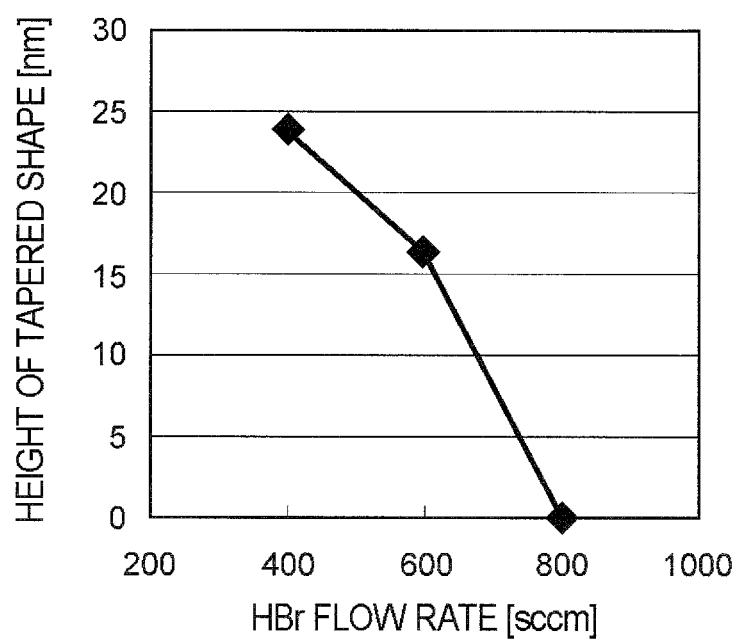
FIG. 18 is a graph illustrating a height of a tapered shape of a dummy semiconductor part DS prepared in Test Examples 5 to 7.

Also, SEM images of the workpieces W after the processings of Test Examples 5 to 7 were acquired and shapes of the dummy semiconductor parts DS were obtained from the SEM images. The results are illustrated in FIG. 17 (Table 6). Further, a graph which represents the heights [see, "H" in FIGS. 7A and 7B] of the tapered shapes of the dummy semiconductor parts DS in the workpieces W after the processings of Test Examples 5 to 7 is represented in FIG. 18. As illustrated in FIGS. 17 and 18, it was confirmed that the heights (H) of tapered shapes may be adjusted by relatively adjusting the flow rate of HBr gas and the flow rate of O$_2$ gas for process S1 by the Test Examples 5 to 7. Specifically, it was confirmed that, when the flow rate of HBr gas is increased and the flow rate of O$_2$ gas is decreased in process S1, the heights (H) of the tapered shapes may be lowered.

Test Examples 8 to 11

In Test Examples 8 to 11, dummy gates for a fin type field effect transistor were formed while changing a processing time for process S2 as a parameter. Each of the workpieces W used in Test Examples 8 to 11 included semiconductor parts 104 having a width of 20 nm at a pitch of 85 nm on a silicon substrate 102, included an insulation layer 106 between the semiconductor parts 104, included a polycrystalline silicon layer PL formed to cover the semiconductor parts 104 and the insulation layer 106, and included a mask M on the polycrystalline silicon layer PL was utilized in the Test Examples 8 to 11. The semiconductor parts 104 protruded to a height of 30 nm from the surface of the insulation layer 106. In addition, the mask included a first layer 210 made of SiO$_2$ and included a second layer 214 made of SiN the first layer 210. The thickness of the first layer 210 was 115 nm, the thickness of the second layer 214 was 50 nm, the line width of the mask M was 35 nm, and the inter-line pitch of the mask M was 85 nm. Processing conditions for Test Examples 8 to 11 are listed in Table 7 of FIG. 19. In addition, the frequency of microwave and the frequency of bias power were set to 2.45 GHz and 13.65 MHz, respectively. Further, the pressure of the processing space in the process S1 and the process S2 was set to 120 mTorr (16 Pa) in Test Examples 8 to 11.

Figure 21:
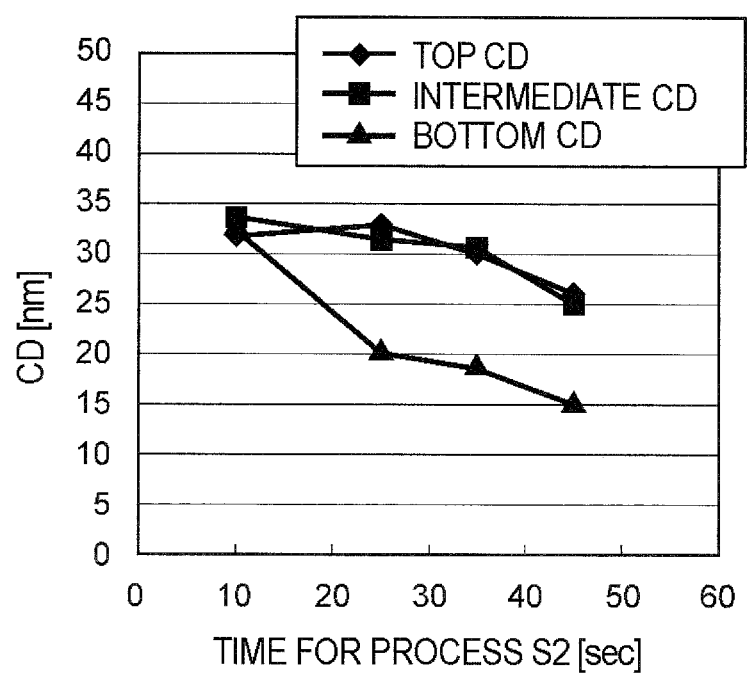
FIG. 21 is a graph illustrating TOP CD, INTERMEDIATE CD and BOTTOM CD of each of the dummy semiconductor parts DS prepared in Test Examples 8 to 11.

Also, SEM images of the workpiece W after the processings of Test Examples 8 to 11 were acquired and shapes of the dummy semiconductor parts DS were obtained from the SEM images. The results are represented in FIG. 20 (Table 8). In FIG. 20, the cross-sectional views depict diagrams of the SEM images. Further, "TOP CD", "INTERMEDIATE CD" and "BOTTOM CD" correspond to a width of an upper end, a width of an intermediate position in the height direction, and a width of the lower end of each dummy semiconductor part DS, respectively. Further, FIG. 21 illustrates a graph which represents TOP CD, INTERMEDIATE CD and BOTTOM CD of the dummy semiconductor parts DS in the workpieces W after the processings of Test Examples 8 to 11. As illustrated in FIGS. 20 and 21, through Text Examples 8 to 11, it was confirmed that tapered shapes may be formed at the bottom portions of dummy semiconductor parts DS and the widths at the bottom portions of the dummy semiconductor parts DS are reduced as the time for process S2 is increased, even in manufacturing the fin type field effect transistor.

Test Examples 12 to 14

In Test Examples 12 to 14, dummy gates for a fin type field effect transistor were formed while changing a power of microwave for process S1 as a parameter. The workpieces W used in Test Examples 12 to 14 were the same as those used in Test Example 8. Processing conditions for Test Examples 12 to 14 are listed in Table 9 of FIG. 22. Further, the frequency of microwave and the frequency of bias power were set to 2.45 GHz and 13.65 MHz, respectively. Further, the pressure of the processing space in process S1 and process S2 was set to 120 mTorr (16 Pa) in Test Examples 12 to 14.

Figure 24:
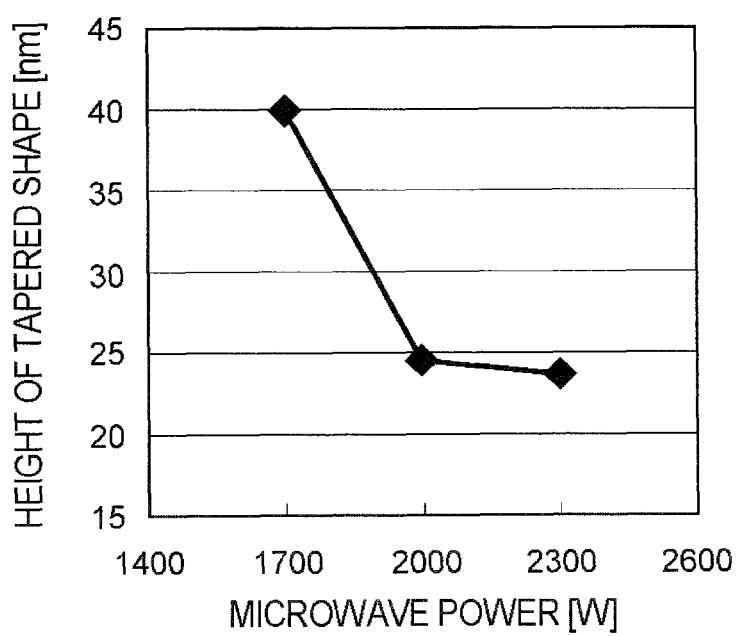
FIG. 24 is a graph representing a height of a tapered shape of each of the dummy semiconductor parts DS prepared in Test Examples 12 to 14.

Also, SEM images of the workpieces W after the processings of Test Examples 12 to 14 were acquired and shapes of the dummy semiconductor parts DS were obtained from the SEM images. The results are illustrated in FIG. 23 (Table 10). Further, a graph which represents the height [see, "H" in FIGS. 7A and 7B] of the tapered shapes of the dummy semiconductor parts DS in the workpieces W after the processings of Test Examples 12 to 14 is illustrated in FIG. 24. As illustrated in FIGS. 23 and 24, through Test Examples 12 to 14, it was confirmed that the heights (H) of tapered shapes may be adjusted by adjusting the power of microwave for process S1. Specifically, it was confirmed that when the power of microwave is increased, the heights (H) of the tapered shapes tend to decrease.

Test Examples 15 and 16

Processings were ended at process S2 in the Test Examples 1 to 14. In Test Examples 15 and 16, however, dummy gates for a fin type field effect transistor were formed using a method which includes processes S1 to S3. In addition, he dummy gates for the fin type field effect transistor were formed while changing a processing time for process S2 and a processing time for process S3 as parameters. The workpieces W utilized in Test Example 15 and Test Example 16 were the same as those used in Test Example 8. Processing conditions for Test Example 15 and Test Example 16 are listed in Table 11 of FIG. 25. In addition, the frequency of microwave and the frequency of bias power were set to 2.45 GHz and 13.65 MHz, respectively. Further, the pressure of the processing space in process S1 and process S2 was set to 120 mTorr (16 Pa) and the pressure of the processing space in process S3 was set to 20 mTorr (2.666 Pa) in Test Example 15 and Test Example 16.

Also, SEM images of the workpiece W after the processings of Test Example 15 and Test Example 16 were acquired and shapes of the dummy semiconductor parts DS were obtained from the SEM images. The results are represented in FIG. 26 (Table 12). In FIG. 26, the cross-sectional views depict diagrams of the SEM images before and after process S3. Further, in FIG. 26, "TAPER ANGLE" refers to an angle between a pair of side surfaces of the bottom portion BP of each dummy semiconductor part DS. As illustrated in FIG. 26, it was confirmed that when process S3 is added, the tapered shapes of the bottom portion BP of each dummy semiconductor part DS have a more acute angle and the pair of side surfaces SS become further smoother at the bottom portion BP.

Various exemplary embodiments have been described above. However, the present disclosure is not limited to the exemplary embodiments and various modifications may be made to the exemplary embodiments. For example, the method illustrated in FIG. 3 is not limited to the plasma processing apparatus which uses microwave as a plasma source, and may be performed using various types of plasma processing apparatuses such as, for example, a parallel planar type plasma processing apparatus or an inductively coupled plasma processing apparatus.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A method of forming a dummy gate in manufacturing a field effect transistor, the method comprising:
    a first process of exposing a workpiece having a polycrystalline silicon layer formed on an insulating layer and a semiconductor part to microwave-generated plasma of HBr gas and $O_2$ gas, the first process including etching the polycrystalline silicon layer until the insulating layer and the semiconductor part are exposed to form a dummy semiconductor part having a pair of side surfaces from the polycrystalline silicon layer, and at the same time, forming a protection film based on a by-product of etching on the pair of side surfaces in such a manner that the thickness of the protection film becomes smaller toward a lower end of the dummy semiconductor part by supplying a relatively smaller amount of activated species of the HBr gas and $O_2$ gas to the lower end of the dummy semiconductor part compared to an upper end of the dummy semiconductor part;
    a second process of further exposing the workpiece to the microwave-generated plasma of HBr gas and $O_2$ gas after the insulating layer and the semiconductor part are exposed during the first process thereby laterally etching the dummy semiconductor part along with the protection film formed on the side surfaces thereof such that a taper-shaped dummy semiconductor part is formed at a lower portion of the dummy semiconductor part which is below a top of the semiconductor part; and
    a third process of further exposing the workpiece to plasma of bromine gas or plasma of chlorine gas after the second process,
    wherein an angle of a corner area formed between the insulating layer and one of the side surfaces on an inside of the dummy semiconductor part is an obtuse angle.

2. The dummy gate forming method according to claim 1, wherein the field effect transistor is a fin type field effect transistor,
    the semiconductor part is a fin type semiconductor part and the workpiece includes one or more fin type semiconductor parts,
    the polycrystalline silicon layer is provided to cover the one or more fin type semiconductor parts prior to the first process, and
    the dummy semiconductor part is formed to extend in a direction intersecting with the one or more fin type semiconductor parts.

3. The method of claim 1, wherein a temperature of the workpiece is set within a range of 60° C.-70° C.

4. The method of claim 1, wherein a relative flow rate of the HBr gas to a flow rate of the $O_2$ gas is controlled to control a height of the taper-shape at the lower portion of the dummy semiconductor part.

5. The method of claim 1, wherein a microwave power is controlled during the second process to control an etching speed such that a height of the taper-shape at the lower portion of the dummy semiconductor part is controlled.

6. The method of claim 5, wherein the microwave power is controlled in a range of 1700 W and 2300 W.

7. The method of claim 1, wherein a time of exposing the workpiece during the second process is adjusted to control an etching amount of the lower portion of the dummy semiconductor part.

8. The method according to claim 1, further including providing a spacer on each side surface of the dummy semiconductor part after the third process with the spacers formed above the insulating layer, and thereafter removing the dummy semiconductor part, and wherein after removal of the dummy semiconductor part an angle between the insulating layer and each spacer at a location between the spacers is an obtuse angle.

\* \* \* \* \*